United States Patent
Crooks

(10) Patent No.: US 10,054,621 B2
(45) Date of Patent: Aug. 21, 2018

(54) METHOD AND APPARATUS FOR A SUPERSPEED USB BUS POWERED REAL-TIME SPECTRUM ANALYZER

(71) Applicant: Test Equipment Plus, Inc., La Center, WA (US)

(72) Inventor: Justin Crooks, Battle Ground, WA (US)

(73) Assignee: Test Equipment Plus, Inc., La Center, WA (US)

( * ) Notice: Subject to any disclaimer, the term of this patent is extended or adjusted under 35 U.S.C. 154(b) by 435 days.

(21) Appl. No.: 14/737,311

(22) Filed: Jun. 11, 2015

(65) Prior Publication Data

US 2016/0003878 A1 Jan. 7, 2016

Related U.S. Application Data

(62) Division of application No. 14/031,969, filed on Sep. 19, 2013, now Pat. No. 9,086,438.

(60) Provisional application No. 61/810,641, filed on Apr. 10, 2013.

(51) Int. Cl.
    *G01R 23/16* (2006.01)
(52) U.S. Cl.
    CPC .................... *G01R 23/16* (2013.01)
(58) Field of Classification Search
    CPC ...................................................... G01R 23/16
    See application file for complete search history.

(56) References Cited

U.S. PATENT DOCUMENTS

| 4,163,944 A * | 8/1979 | Chambers | H03C 1/54 375/309 |
| 5,428,840 A * | 6/1995 | Sadhir | H03D 7/1408 333/26 |
| 2012/0274309 A1* | 11/2012 | Suryan | G01R 23/16 324/76.29 |

OTHER PUBLICATIONS

Mini-Circuits, SIM-83LH+ Frequency Mixer Data Sheet, p. 1, Aug. 16, 2010, Brooklyn, New York.

* cited by examiner

*Primary Examiner* — Noam Reisner
(74) *Attorney, Agent, or Firm* — Rylander & Associates, PC; Philip R. M. Hunt

(57) ABSTRACT

An RF processing module that when coupled to a computer having appropriate signal processing software will function as a spectrum analyzer. The RF processing module has a first stage mixer and a switch that allows either port of the first stage mixer to be selected as the input and receive the RF signal. The RF processing module has a sample packing buffer that packs digitized signal samples into a fewer number of longer words and loads the words into a circular buffer and from then to one of two DMA channels on a USB link. The circular buffer can be emptied faster than it can be filled, allowing the sample packing buffer to create time intervals for a USB controller to switch DMA channels. LO leakage through the mixer-to-IF path is used to self-calibrate the filter's frequency response as temperature and other environmental factors change.

10 Claims, 1 Drawing Sheet

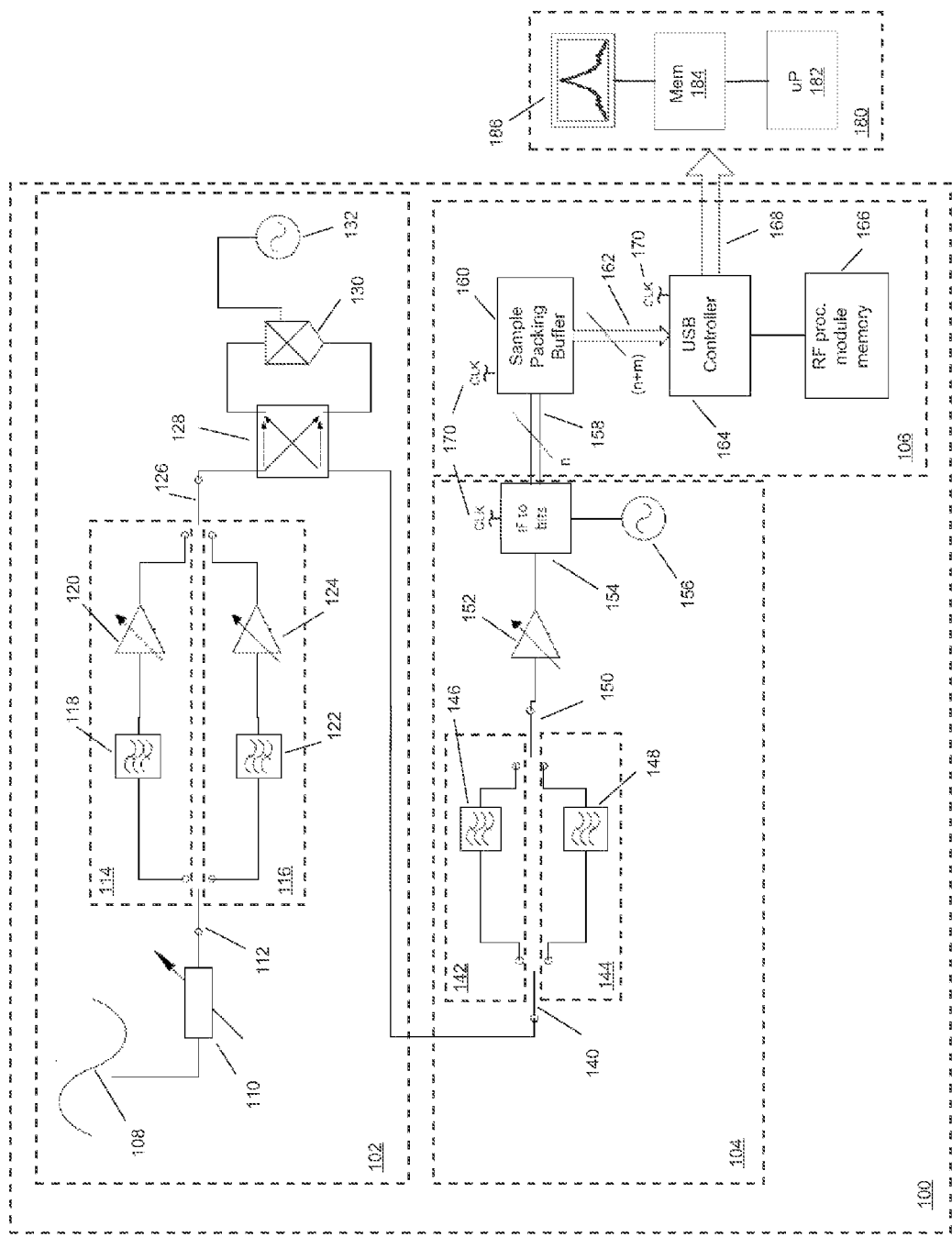

METHOD AND APPARATUS FOR A SUPERSPEED USB BUS POWERED REAL-TIME SPECTRUM ANALYZER

CROSS-REFERENCE TO RELATED APPLICATION

The present application is a divisional application of application Ser. No. 14/031,969, filed Sep. 19, 2013, which claims the benefit of U.S. Provisional Application No. 61/810,641 filed Apr. 10, 2013, incorporated herein by reference.

FIELD OF THE INVENTION

The present invention relates generally to electronic test equipment, and more particularly, to radio frequency (RF) spectrum analyzers, RF recording systems, and Universal Serial Bus (USB)-based electronic test equipment.

BACKGROUND

The term "spectrum analyzer" refers to a device used to examine the spectral composition of a radio frequency (RF) input signal. A spectrum analyzer typically comprises components including an attenuator to reduce the RF input signal amplitude; one or more mixers and one or more local oscillators (LO) to convert the RF input signal to an intermediate frequency (IF) signal; and a system of filtering and measuring the resultant IF signal. A spectrum analyzer may use several frequency bands to cover a broad frequency spectrum, analyzing one band at a time.

When spectrum analyzers convert the RF signal to an IF signal there is attenuation, an amplitude loss (or gain), which must be corrected in hardware or software before the signal amplitude is displayed. This amplitude loss can be thought of as the sum of the losses through the various elements in the signal path, such as mixers and filters, where the amplitude loss from each element is dependent on the frequency of the signal passing through it. The attenuation vs. frequency for these elements often changes significantly with temperature.

Many modern spectrum analyzers use the Fast Fourier Transform (FFT) technique to convert time-domain signal data into frequency-domain signal data. Processing high-resolution FFTs quickly requires a powerful processor, and depends on the correct utilization of processor resources, such as parallel processing across multiple processor cores, and utilization of Single Instruction, Multiple Data (SIMD) instructions, such as Advanced Vector Extensions (AVX). The SIMD instructions for modern processors have recently made tremendous advances, including the introduction of Fused Multiply Accumulate, promising to advance the signal processing capabilities of a desktop or laptop Personal Computer (PC) even further.

Handheld spectrum analyzers contain fewer, simpler, and less accurate components and consume less power than traditional portable or bench top spectrum analyzers. They typically have a Liquid Crystal Display (LCD) and buttons for a user interface. They are generally not capable of processing automation commands and are of minimal usefulness in a lab setting. They usually have slower processors which are not capable of quickly processing very large FFTs, and are therefore of limited usefulness regarding real-time spectrum analysis. Their processors are usually fixed and cannot be readily upgraded.

A key specification for modern spectrum analysis is the real-time streaming bandwidth (RTS bandwidth), the amount of RF spectrum which can be simultaneously acquired and analyzed. This RTS bandwidth is limited by the Nyquist frequency and several other factors, limiting it to less than ½ of the sample rate, with a more practical limit around ⅓ of the sample rate or less. Therefore, the RTS bandwidth is limited by the number of samples per second which can be transferred to the processor.

The amplitude accuracy of the data returned is dependent on knowing the path loss for any given temperature. If an IF filter has passband ripple of 1.5 dB, characterizing the shape of this ripple is necessary to properly correct for it.

Owning a modern spectrum analyzer capable of streaming 20 MHz or more of real-time spectrum is currently cost prohibitive for many small businesses, students, and inventors. What is needed is a low-cost, low-power, lightweight, portable spectrum analyzer similar in size and weight to a traditional RF power sensor, that is capable of correcting for filter and mixer loss across its operating temperature with minimal additional circuitry, combined with the signal processing power of the modern personal computer, and that will benefit from newer, more powerful PC/laptop processors as they become available.

SUMMARY AND ADVANTAGES

According to at least one embodiment, a RF processing module is described herein that when coupled to a computer having appropriate signal processing software, will function as a spectrum analyzer. This RF processing module is USB bus-powered, consumes less than 5 watts of power, and weighs less than 500 g.

The RF processing module has a first stage mixer and a Transmit/Receive (T/R) switch that allows either port of the first stage mixer to be selected as the input and then receive the RF signal at the selected port. The non-selected port is then the output for the IF signal. This enables a single double-balanced mixer to cover the entire spectrum from 9 kHz to 6 GHz, thus simplifying the design from prior art.

The RF processing module has a sample packing buffer and a USB controller for packing and transmitting digitized signal samples out a USB link to the computer. The USB controller has three independent direct memory access (DMA) channels for transferring data over three unique USB endpoints, one for receiving commands, and the other two for streaming data, all over the USB link. The sample packing buffer uses a special technique of packing the digitized signal samples into a fewer number of longer words and loading a circular buffer. The sample packing buffer sends the packed words from the circular buffer to one of the two DMA channels. The circular buffer can be emptied faster than it can be filled, allowing the sample packing buffer to create time intervals for the USB controller to switch DMA channels without dropping any of the digitized signal samples.

A method is disclosed for using LO leakage through the mixer-to-IF path to self-calibrate the filter's frequency response as temperature and other environmental factors change.

BRIEF DESCRIPTION OF THE DRAWINGS

The present invention will be described by way of exemplary embodiments, but not limitations, illustrated in the accompanying drawings in which like references denote similar elements. The accompanying drawings, which are incorporated into and constitute a part of this specification, illustrate one or more embodiments of the invention and, together with the detailed description, serve to explain the principles and implementations of the invention.

FIG. 1 shows a block diagram of an RF processing module and a computer that together function as a spectrum analyzer.

DETAILED DESCRIPTION

Before beginning a detailed description of the subject invention, mention of the following is in order. When appropriate, like reference materials and characters are used to designate identical, corresponding, or similar components in different figures. The figures associated with this disclosure typically are not drawn with dimensional accuracy to scale, i.e., such drawings have been drafted with a focus on clarity of viewing and understanding rather than dimensional accuracy.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Use of directional terms such as "upper," "lower," "above," "below", "in front of," "behind," etc. are intended to describe the positions and/or orientations of various components of the invention relative to one another as shown in the various Figures and are not intended to impose limitations on any position and/or orientation of any embodiment of the invention relative to any reference point external to the reference.

Spectrum Analyzer—Overview

FIG. 1 shows a block diagram of an RF processing module 100 and a computer 180 that together function as a spectrum analyzer. The RF processing module 100 is configured to take in an RF signal, convert it to digital samples and output a stream of the digital samples to a computer 180. The computer 180 has a microprocessor 182 that converts the digital samples from time domain to frequency domain and preforms various analyses on the frequency domain samples. The computer 180 has a memory 184 for storing samples and analysis results. The computer 180 may have a computer display 186 for displaying the analysis results. While a traditional spectrum analyzer uses a digital signal processor selected at design time, the digital signal processing for this invention may be upgraded simply by upgrading the computer microprocessor 182.

The RF processing module 100 has an RF/IF section 102, an IF/Digital section 104 and a digital transmission section 106. The RF/IF section 102 converts an incoming RF signal to an IF signal. The IF/Digital section 104 converts the IF signal to a stream of time-domain samples. The digital transmission section 106 takes the stream of time-domain samples, places the time-domain samples in packets and transmits the packets out a USB SuperSpeed link.

RF/IF Section

The RF/IF section 102 has a RF input 108 and digital step attenuator 110. An RF signal entering the RF input 108 is routed through the digital step attenuator 110. The attenuated RF signal is then routed to a high band RF signal path 114 or a low band RF signal path 116 by a first RF signal path switch 112 and a second RF signal path switch 126. If the frequency band to be analyzed is above an RF section split frequency (2 GHz in the preferred embodiment), then the RF signal path switches 112, 126 are set to route the RF signal through the high band RF signal path 114. If the frequency band to be analyzed is below the RF split frequency, then the RF signal path switches 112, 126 are set to route the RF signal through the low band RF signal path 116. The high band RF signal path 114 has an RF high band filter 118 and an RF high band variable gain amplifier (VGA) 120. The low band RF signal path 116 has an RF low band filter 122 and an RF low band VGA 124. Regardless which RF signal path 114, 116 is selected, the RF signal is filtered to remove image responses and amplified or attenuated before mixing. In the preferred embodiment, the RF section split frequency is 2 GHz a value selected to co-ordinate with the values of the other components of the preferred embodiment of the RF processing module 100 according to the principals described herein. However, in other embodiments, another value for the RF section split frequency may be used, as long as it co-ordinates with the values of the other components of the RF processing module 100 according to said principles.

The RF/IF section 102 also has a Transmit/Receive (T/R) switch 128, a first mixer 130 and a first local oscillator 132. The first local oscillator 132 sends a first local oscillator signal to the first mixer 130, which combines it with the incoming RF signal to generate the IF signal. In the preferred embodiment, the first local oscillator 132 operates from 2.45 to 8 GHz (except for self-calibration, where it may operate at a lower frequency). The first local oscillator 132 is buffered or doubled from a wideband synthesizer (not shown).

The T/R switch 128 allows either port of the first mixer 130 to be selected as the input and receive the RF signal. The non-selected port of the first mixer 130 is then the output for the IF signal. Since a typical mixer is designed for an RF signal that starts well above 9 kHz, and an IF signal that ends well below 6 GHz, this novel approach allows frequencies below the RF section split frequency (2 GHz in the preferred embodiment) to be up-converted to a first IF (2.45 GHz in the preferred embodiment), and frequencies above the RF section split frequency to be up-converted or down-converted to the first IF or to a second IF (1.27 GHz in the preferred embodiment). Although any IF frequency could be used from 400 MHz to 3 GHz, the first IF and second IF are selected to allow for good RF image rejection in every band. This enables a single double-balanced mixer to cover the entire spectrum from 9 kHz to 6 GHz, thus simplifying the design from prior art.

IF/Digital Section

The IF/Digital section 104 has two IF signal paths available. The IF signal is routed either to a first IF signal path 142 or a second IF signal path 144 by a first IF signal path switch 140 and a second IF signal path switch 150. If the IF signal generated by the first mixer 130 is centered at the first IF, then the IF signal path switches 140, 150 are set to route the IF signal through the first IF signal path 142. If the IF signal is centered at the second IF, then the IF signal path switches 140, 150 are set to route the IF signal through the second IF signal path 144. The first IF signal path 142 has first IF path filter 146 and the second IF signal path 144 has a second IF path filter 148. The first IF path filter 146 is centered at the first IF and the second IF path filter 148 is centered at the second IF. Regardless which IF signal path 142, 144 is selected, the IF signal is filtered to remove image responses and spurs. In the preferred embodiment, the first and second IF path filters 146, 148 are Surface Acoustic Wave (SAW) filters. Additional gain or attenuation is applied after the IF path filters 146, 148 by an IF VGA 152.

An IF-to-bits module 154 follows the IF VGA 152 in the IF/Digital section 104. The IF-to-bits module 154 has a second mixer, a final gain stage, a SAW filter, and an analog-to-digital converter (ADC) that digitizes the data. The second mixer uses a signal from a second local oscillator 156 to convert the IF signal to a baseband signal. ADC sampling bandwidth is defined as the bandwidth the ADC is capable of converting. The SAW filter has a passband that is no more than half the ADC sampling bandwidth. Passing the baseband signal through the SAW filter limits the bandwidth of the baseband signal to the bandwidth of the SAW filter. The ADC converts the baseband signal to a stream of digitized signal samples, with each digitized signal sample n-bits in length. In the preferred embodiment, the sampling bandwidth of the ADC is 125 MHz, the SAW bandwidth is 20 MHz with a nominal center frequency of 140 MHz and n=14, but other embodiments may have other values consistent with the principles described herein. In the preferred embodiment, the IF-to-bits module 154 is an integrated circuit, specifically an LTM9005 by Linear Technology, but may be realized as an Application Specific Integrated Circuit (ASIC) or in other ways.

Digital Transmission Section

The final section of the RF processing module 100 is the digital transmission section 106. The digital transmission section 106 has a sample packing buffer 160, a USB controller 164 and a RF processing module memory 166. The sample packing buffer 160 is connected to the IF-to-bits module 154 with a first hardware interface 158 of n bits in width. The sample packing buffer 160 is connected to the USB controller 164 with a second hardware interface 162 of (n+m) bits in width. In the preferred embodiment, the sample packing buffer 160 is realized with a Field Programmable Gate Array (FPGA), specifically a Spartan-3AN by Xilinx, but in other embodiments may be realized in other ways such as with an ASIC. In the preferred embodiment, the USB controller 164 is a controller for a USB 3.0 SuperSpeed serial communications port, specifically a CYUSB3014 by Cypress, but in other embodiments may be a controller for a different communications protocol, such as a later version of USB.

The stream of n-bit digitized signal samples is passed from the ADC of the IF-to-bits module 154 to the sample packing buffer 160. The sample packing buffer 160 then packs the n-bit digitized signal samples into words that are (n+m)-bits in length. In the preferred embodiment n=14 and m=2, with the words 16 bits in length. The sample packing buffer 160 buffers the words packed with digitized signal samples in a circular buffer. The circular buffer has a size b, given in words of (n+m) length. The circular buffer is sized to be at least large enough to allow for the DMA channel switch, described further herein. In the preferred embodiment, the circular buffer size b=4096 words of 16 bit length.

The sample packing buffer 160 is configured to send the sample packed words to the USB controller 164 as packets. In the preferred embodiment, each packet is 32 kB in length, contains 18,688 samples of 14-bit digitized signal samples packed into 16,384 words of 16 bits plus a 32 byte trailer, supplied by the sample packing buffer 160, and a 32 byte header tacked on by the USB controller 164. The sample packing buffer 160 begins transferring the packet to the USB controller 164 well before all the digitized signal samples for the entire packet have been received by the sample packing buffer 160. In the preferred embodiment, the sample packing buffer 160 begins transferring a packet after 2044 digitized signal samples are received.

The USB controller 164 is programmed with three independent direct memory access (DMA) channels for transferring data over three unique USB endpoints, one for receiving commands, and the other two for streaming data, all over a USB link 168. Each DMA channel has its own buffer in the USB controller 164, and its own USB endpoint. The two DMA channels share the second hardware interface 162 to the sample packing buffer 160, as well as sharing the USB link 168. While one DMA channel is streaming data over the USB link 168, another is receiving data from the sample packing buffer 160.

A clock signal 170 is fed to the IF-to-bits module 154 and the sample packing buffer 160 and controls the ADC operation in the IF-to-bits module 154, the word packing operation in the sample packing buffer 160 and the packet transfer from the sample packing buffer 160 to the USB controller 164. Using a single clock for these operations greatly reduces the complexity of the design and clock noise. In the preferred embodiment, the clock signal 170 is 80 MHz.

The sample packing buffer 160 uses a special technique of packing the digitized signal samples and loading the circular buffer in only (c−1) clock cycles out of c clock cycles where c=((m+n)/m) and n evenly divides by m. This is accomplished by loading, during the first clock cycle of c clock cycles, the first of c samples into n flip flops. Then in each of the remaining c clock cycles, m bits from the flip-flops are loaded with the n bits of the next of the c samples into a (m+n) bit word and the word is transferred to the circular buffer. In the preferred embodiment, during the first clock cycle of 8, the first of 8 samples is loaded into 14 flip flops, then in each of the next 7 cycles, 2 bits from the flip-flops are loaded along with 14 bits of the next sample (out of the 8 samples) into a 16 bit word and the word is transferred to the circular buffer. In only 7 out of 8 cycles is the circular buffer loaded. However, words can be unloaded from the circular buffer and sent out the second hardware interface 162 in each cycle. This allows the sample packing buffer 160 to transfer information out the second hardware interface 162 to the USB controller 164 faster than it receives information in the first hardware interface 158 from the IF-to-bits module 154, allowing the circular buffer to empty down. The circular buffer fills again during the switch between DMA channels.

The described packing technique enables the use of a single universal clock signal for the IF-to-bits module 154, the sample packing buffer 160 and the USB controller 164. This packing technique also slightly reduces resources used in the sample packing buffer 160 as compared to more common bit packing algorithms such as barrel shifting.

The USB controller 164 acts as a controller for the entire RF processing module 100. In the preferred embodiment, the USB controller 164 utilizes the sample packing buffer 160 for fan-out of control signals to other components of the RF processing module 100, further reducing resources required by any FPGA that is used to realize the sample packing buffer 160.

There is a finite amount of time required to swap the DMA channels, during which time no data can be transferred across either DMA channel, but since the digital transmission section 106 transfers fewer (n+m) bit words than n bit digitized signal samples, there are cycles when no data need to be transferred from the sample packing buffer 160 to the DMA channel buffers on the USB controller 164 or across the DMA channel. If the packets are long enough, there is ample time for swapping DMA channels. For example, in the preferred embodiment, 18,688 digital signal samples, 14 bits in length, are received by the sample packing buffer 160 in 18,688 clock cycles, but only 16,384 clock cycles are required to transfer the 16 bit words packed with the digital signal samples to the USB controller 164, so there is some idle time during which this swap can occur. By using the two alternating DMA channels on the USB controller 164 as the primary data buffers, and beginning transfer of a packet from the sample packing buffer 160 to the USB controller 164 before all the digital signal samples for the entire packet are received by the sample packing buffer 160, the resources required by the sample packing buffer 160 are minimized. In the preferred embodiment, this approach requires less than 8 kB of RAM from the FPGA used to realize the sample packing buffer 160.

Information about data transfer errors, ADC overflows, and trigger events is embedded in the packet trailer enabling enhanced spectrum analysis functions such as Global Positioning System (GPS) time stamping and time-gated spectrum analysis, as well as providing the user with information regarding data integrity.

Temperature Correction Methods

As part of the process of manufacturing the RF processing module 100, temperature correction data is collected at 10 degree Celsius steps over the device's operating temperature inside a temperature chamber, and stored on the RF processing module 100 in a memory 166. The RF processing module memory 166 is non-volatile. Data correcting for overall path loss for the entire operating range of the device at the time of manufacture is collected on a PC then fed back to the RF processing module memory 166.

The SAW in the IF-to-bits module 154 may have over 1 dB of peak-to-peak ripple in its bandpass which cannot be corrected using 10 degree Celsius steps, as it will shift drastically as the RF processing module 100 is warmed or cooled by only a few degrees. An additional self-calibration method is used to provide amplitude vs. frequency corrections for this filter without requiring additional circuitry to generate a separate internal calibration signal.

This self-calibration method determines two things: 1) the actual center frequency of this SAW at its current temperature, and 2) the frequency response of the SAW at its current temperature. Once the frequency response of the SAW is known, it can then be corrected for with amplitude corrections, independent of the other circuitry. Amplitude corrections are applied after the signal is transformed into the frequency domain via FFT on the computer 180, using optimized routines built using the best family of Single Instruction Multiple Data (SIMD) instructions for a given processor, such as Advanced Vector Extensions (AVX).

In this self-calibration method, the only signals present in the RF processing module 100 are from the two local oscillators 132, 156, generated from multi-octave wideband synthesizers. The first local oscillator 132 is operated at a fixed frequency, (therefore at a fixed LO-to-IF leakage frequency and amplitude). The second local oscillator 156 is swept across a range of frequencies selected so that the resultant IF signal is swept across the nominal passband of the SAW inside the IF-to-bits module 154. Data is acquired by the ADC while sweeping the SAW. This data is then processed by the computer 180, obtaining the actual center frequency, the frequency response and amplitude corrections for the SAW at the current temperature.

The actual center frequency of the SAW at the current temperature is obtained from the data acquired by the ADC while sweeping the SAW. Using this data, signal processing is used to find the 3 dB points (where the response is 3 dB lower than peak), and then find the halfway point between the 3 dB points. The 3 dB points can also be used to determine the maximum bandwidth available at the current temperature. By using the actual center frequency of the SAW, and allowing frequency sweeps to be adjusted accordingly, the amount of useable bandwidth can be maximized for any given temperature, enabling fast sweeps independent of the nominal SAW center frequency.

While the foregoing written description of the invention enables one of ordinary skill to make and use what is considered presently to be the best mode thereof, those of ordinary skill will understand and appreciate the existence of variations, combinations, and equivalents of the specific embodiment, method, and examples herein. The invention should therefore not be limited by the above described embodiment, method, and examples, but by all embodiments and methods within the scope and spirit of the invention.

Those skilled in the art will recognize that numerous modifications and changes may be made to the preferred embodiment without departing from the scope of the claimed invention. It will, of course, be understood that modifications of the invention, in its various aspects, will be apparent to those skilled in the art, some being apparent only after study, others being matters of routine mechanical, chemical and electronic design. No single feature, function or property of the preferred embodiment is essential. Other embodiments are possible, their specific designs depending upon the particular application. As such, the scope of the invention should not be limited by the particular embodiments herein described but should be defined only by the appended claims and equivalents thereof.

What is claimed is:

1. A device comprising:
   a mixer configured to convert a Radio Frequency (RF) signal to an Intermediate Frequency (IF) signal using a local oscillator signal, the mixer having a first port, a second port, and a local oscillator input, wherein the mixer is double balanced;
   a Transmit/Receive (T/R) switch configured to route the RF signal to the first port of the mixer when the T/R switch is in a first T/R switch position and configured to route the RF signal to the second port of the mixer when the T/R switch is in a second T/R switch position; and
   an IF-to-bits module configured to receive the IF signal and generate a stream of digital signal samples of the IF signal.

2. The device as recited in claim 1, further comprising:
   a high band RF signal path;
   a low band RF signal path; and
   an RF signal path switch configured to transmit the IF signal to the mixer and configured to receive the RF signal from the high band RF signal path when in a first RF signal path switch position and to receive the RF signal from the low band RF signal path when in a second RF signal path switch position.

3. The device as recited in claim 2, further comprising:
wherein the RF signal path switch is configured to be in the first RF signal path switch position when a frequency band to be analyzed is above a first frequency; and
wherein the RF signal path switch is configured to be in the second RF signal path switch position when a frequency band to be analyzed is below the first frequency.

4. The device as recited in claim 3, further comprising:
wherein the T/R switch is configured to be in the first T/R switch position and when the frequency band to be analyzed is above the first frequency; and
wherein the T/R switch is configured to be in the second T/R switch position when the frequency band to be analyzed is below the first frequency.

5. The device as recited in claim 4, further comprising:
a first IF filter path;
a second IF filter path;
a first IF signal path switch configured to receive the IF signal from the mixer and configured to route the IF signal to the first IF filter path when in a first IF signal path switch position and to route the IF signal to the second IF filter path when in a second IF signal path switch position; and
a second IF signal path switch configured to transmit the IF signal to the IF-to-Bits module and configured to receive the IF signal from the first IF filter path when in a first IF signal path switch position and to receive the IF signal from the second IF filter path when in a second IF signal path switch position.

6. A system comprising:
a mixer configured to convert a Radio Frequency (RF) signal to an Intermediate Frequency (IF) signal using a local oscillator signal, the mixer having a first port, a second port, and a local oscillator input, wherein the mixer is double balanced;
a Transmit/Receive (T/R) switch configured to route the RF signal to the first port of the mixer when the T/R switch is in a first T/R switch position and configured to route the RF signal to the second port of the mixer when the T/R switch is in a second T/R switch position;
an IF-to-bits module configured to receive the IF signal and generate a stream of digital signal samples of the IF signal; and
a processor that converts the digital signal samples from time domain to frequency domain samples and stores the frequency domain samples in a memory.

7. The device as recited in claim 6, further comprising:
a high band RF signal path;
a low band RF signal path; and
an RF signal path switch configured to transmit the IF signal to the mixer and configured to receive the RF signal from the high band RF signal path when in a first RF signal path switch position and to receive the RF signal from the low band RF signal path when in a second RF signal path switch position.

8. The device as recited in claim 7, further comprising:
wherein the RF signal path switch is configured to be in the first RF signal path switch position when a frequency band to be analyzed is above a first frequency; and
wherein the RF signal path switch is configured to be in the second RF signal path switch position when a frequency band to be analyzed is below the first frequency.

9. The device as recited in claim 8, further comprising:
wherein the T/R switch is configured to be in the first T/R switch position and when the frequency band to be analyzed is above the first frequency; and
wherein the T/R switch is configured to be in the second T/R switch position when the frequency band to be analyzed is below the first frequency.

10. The device as recited in claim 9, further comprising:
a first IF filter path;
a second IF filter path;
a first IF signal path switch configured to receive the IF signal from the mixer and configured to route the IF signal to the first IF filter path when in a first IF signal path switch position and to route the IF signal to the second IF filter path when in a second IF signal path switch position; and
a second IF signal path switch configured to transmit the IF signal to the IF-to-Bits module and configured to receive the IF signal from the first IF filter path when in a first IF signal path switch position and to receive the IF signal from the second IF filter path when in a second IF signal path switch position.

* * * * *